United States Patent [19]
Arase

[11] Patent Number: 6,072,721
[45] Date of Patent: Jun. 6, 2000

[54] SEMICONDUCTOR NONVOLATILE MEMORY, METHOD OF DATA PROGRAMMING OF SAME, AND METHOD OF PRODUCING SAME

[75] Inventor: Kenshiro Arase, Kanagawa, Japan

[73] Assignee: Sony Corporation, Tokyo, Japan

[21] Appl. No.: 09/064,743

[22] Filed: Apr. 23, 1998

[30] Foreign Application Priority Data

May 23, 1997 [JP] Japan ............................. P09-133546

[51] Int. Cl.[7] .................................................. G11C 16/04
[52] U.S. Cl. ............................. 365/185.11; 365/185.12; 365/185.25; 365/204
[58] Field of Search ..................... 365/185.11, 185.12, 365/230.03, 203, 185.25, 204

[56] References Cited

U.S. PATENT DOCUMENTS

| | | | |
|---|---|---|---|
| 5,673,223 | 9/1997 | Park ................................... | 365/185.11 |
| 5,877,982 | 3/1999 | Iwashahi ............................ | 365/185.17 |
| 5,914,903 | 6/1999 | Kanma et al. .................... | 365/365.203 |
| 5,923,587 | 7/1999 | Choi ................................... | 365/185.11 |

*Primary Examiner*—Son T. Dinh
*Attorney, Agent, or Firm*—Ronald P. Kananen; Rader, Fishman & Grauer

[57] ABSTRACT

A semiconductor nonvolatile memory device where the source line is selected and the channel portions of NAND strings adjacent in the row direction are charged up to the programming prohibit potential, the programming prohibit potential charged in the channel portion of the NAND strings is discharged to the bit lines according to the content of data to be programmed, and then the programming voltage is supplied to the selected word line and page programming is carried out together for memory transistors connected to the selected word lines. By this, the memory is suited for operation by a single power supply at a low voltage, enables easy layout of the data latch circuits for every bit line, and in addition performs a data programming operation with a good disturb tolerance.

10 Claims, 13 Drawing Sheets

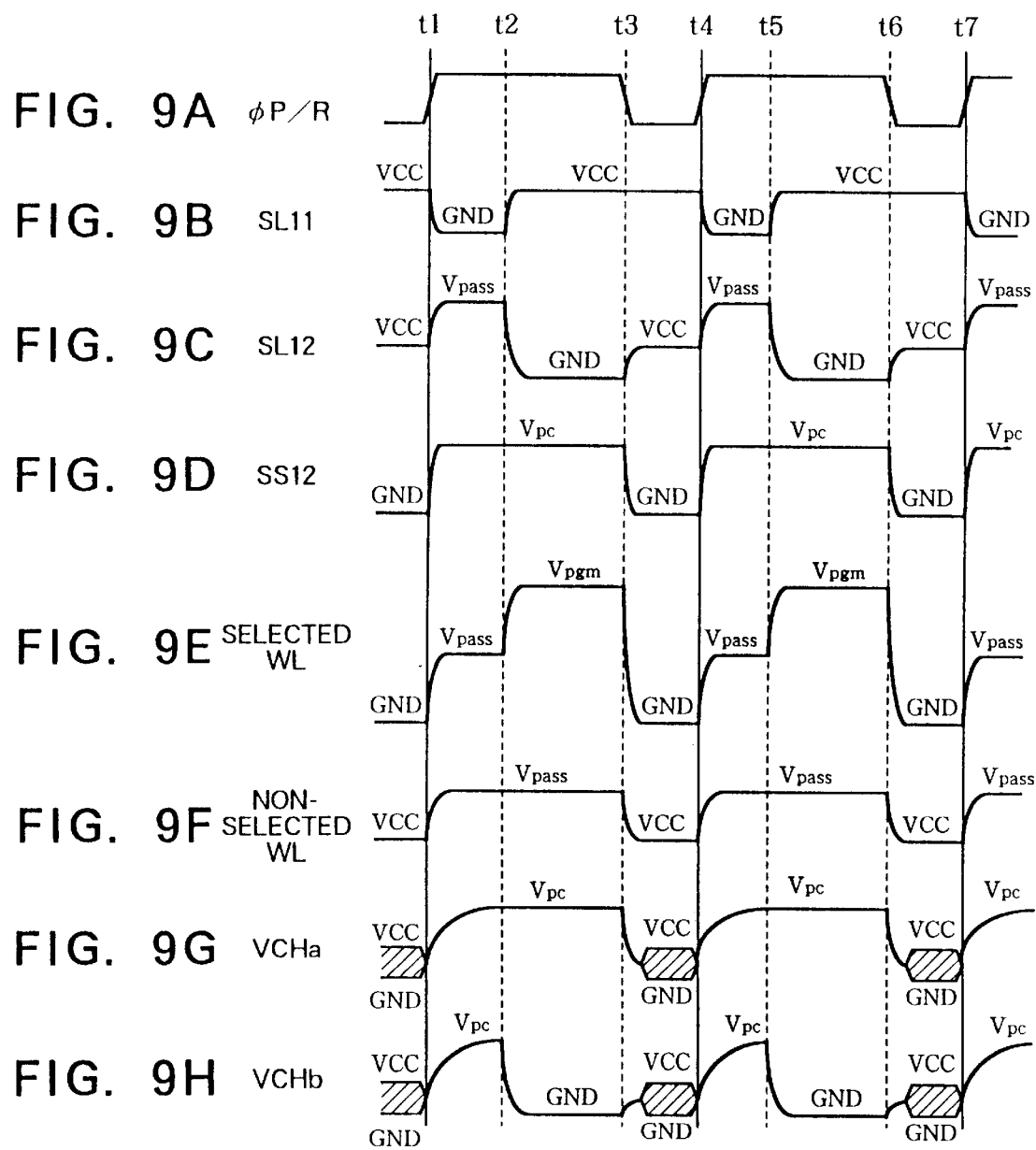

FIG. 10

| OPERATION | | PROGRAM (AT PRECHARGE) | PROGRAM (AT REAL PROGRAMMING) | ERASING | READING |
|---|---|---|---|---|---|
| COMMON PORTION | BLa | VCC (3.3V) NON-SELECTED | VCC (3.3V) NON-SELECTED | FLOATING | 1/2VCC PRECAHRGE |
| | BLb | GND (0V) SELECTED | GND (0V) SELECTED | FLOATING | 1/2VCC PRECAHRGE |
| | SELECTED SOURCE LINE (SSL12) | Vpc (9V) | Vpc (9V) | FLOATING | GND (0V) |
| | NON-SELECTED SOURCE LINE (SSL12) | GND (0V) | GND (0V) | FLOATING | FLOATING |
| | pWELL | GND (0V) | GND (0V) | Verase (22V) | GND (0V) |
| SELECTED BLOCK | SL11 | GND (0V) | VCC (3.3V) | Verase (22V) | VCC (3.3V) |
| | WL11 | Vpass (9V) NON-SELECTED | Vpass (9V) NON-SELECTED | GND (0V) | VCC (3.3V) NON-SELECTED |
| | WL12 | Vpass (9V) SELECTED | Vpgm (18V) SELECTED | GND (0V) | GND (0V) SELECTED |
| | WL13 | Vpass (9V) NON-SELECTED | Vpass (9V) NON-SELECTED | GND (0V) | VCC (3.3V) NON-SELECTED |
| | WL14 | Vpass (9V) NON-SELECTED | Vpass (9V) NON-SELECTED | GND (0V) | VCC (3.3V) NON-SELECTED |
| | SL12 | Vpass (9V) | GND (0V) | Verase (22V) | VCC (3.3V) |
| NON-SELECTED BLOCK | SL21 | GND (0V) | GND (0V) | Verase (22V) | GND (0V) |
| | WL21 | GND (0V) | GND (0V) | Verase (22V) | GND (0V) |
| | WL22 | GND (0V) | GND (0V) | Verase (22V) | GND (0V) |
| | WL23 | GND (0V) | GND (0V) | Verase (22V) | GND (0V) |
| | WL24 | GND (0V) | GND (0V) | Verase (22V) | GND (0V) |
| | SL22 | GND (0V) | GND (0V) | Verase (22V) | GND (0V) |

SEMICONDUCTOR NONVOLATILE MEMORY, METHOD OF DATA PROGRAMMING OF SAME, AND METHOD OF PRODUCING SAME

BACKGROUND OF THE INVENTION

1. Field of the Invention

The present invention relates to a semiconductor nonvolatile memory device such as a NAND type flash memory suitable for operation by a single power supply at a low voltage, a method of data programming of the same, and a method of producing the same.

2. Description of the Related Art

Conventionally, in semiconductor nonvolatile memory devices such as EPROM's or flash memories, the mainstream was a NOR type semiconductor nonvolatile memory device programming data by injecting electrons into a floating gate by injection of channel hot electrons (hereinafter referred to as "CHE's").

In a NOR type semiconductor nonvolatile memory device, however, two memory transistors share one bit contact and source line, therefore there is a problem in that higher integration is difficult and an increase of capacity cannot be achieved.

From the above viewpoint, a NAND type flash memory realizing higher integration by connecting a plurality of memory transistors in series to constitute a NAND string and having two NAND strings share one bit contact and source line has been proposed.

In a general NAND type flash memory, in an erasing operation, 0V is supplied to all word lines of a selected NAND string block, and a high voltage (for example 20V) is supplied to all word lines of non-selected NAND string blocks and a substrate of a memory array.

As a result, electrons are pulled out of the floating gates of only the memory transistors of the selected NAND string block to the substrate. The threshold voltage of the memory transistors shifts in a negative direction and becomes for example about −3V.

On the other hand, the operation for programming data is carried out together for memory transistors connected to the selected word lines in so-called page units. A high voltage (for example, 18V) is supplied to the selected word lines, 0V is supplied to the bit lines to which the ("1" data) memory transistors which are to be programmed are connected, and an intermediate voltage (for example, 9V) is supplied to the bit lines to which the ("0" data) memory transistors which are prohibited from being programmed are connected.

As a result, electrons are injected into the floating gates of only the selected memory transistors which are to be programmed. The threshold voltage of the selected memory transistors shifts in a positive direction and becomes for example about 2V.

In such a NAND type flash memory, both the programming and erasing of the data are carried out by an FN (Fowler-Nordheim) tunnel current. Therefore, there are the advantages that it is relatively easy to supply an operating current from a booster circuit inside the chip and that operation by a single power source is easy.

Further, since the data is programmed in units of pages, that is, all together for memory transistors connected to the selected word line, as a natural result, this memory Is superior in the point of the programming speed.

Nevertheless, the above NAND type flash memory has the following disadvantage.

Namely, since the data programming operation of the NAND type flash memory is carried out in units of pages, it is necessary to supply an intermediate voltage (for example 9V) to all bit lines to which memory transistors for which programming is prohibited are connected.

The number of bit lines in a page unit usually is as much as that for 512 bytes, that is, about 4000. Therefore, the load of the booster circuit for generating the intermediate voltage is large.

Further, in the above data programming operation, due to the necessity of controlling the threshold voltage of the programmed memory transistors, the programming/verifying operation is repeatedly carried out a number of times, therefore it is necessary to charge the bit lines for which programming is prohibited to the intermediate voltage at every programming operation.

For this reason, when the number of times of the programming/verifying operation becomes large, the time required for switching of the bit line voltage in the programming/verifying operation rather becomes greater than the substantive programming time. The programming speed is therefore restricted and high speed programming becomes difficult.

Further, the data latch circuits provided for every bit line for latching the page data must be made so durable against high voltages in specifications as to handle the intermediate voltage. The size inevitably becomes large, and accordingly it becomes difficult to lay out the data latch circuits for every bit line.

A new method of programming of an NAND type flash memory which solves the above problems, which is suited for operation by a single power supply at a low voltage, which is able to be processed at a high speed, and in addition which enables easy layout of the data latch circuits for the bit lines is disclosed from p. 1152 to p. 1153 and FIG. 5 to FIG. 6 of the "IEEE Journal of Solid-State Circuits", vol. 30, No. 11, November 1995.

In the data programming operation disclosed in the above document, NAND strings to which memory transistors for which programming is prohibited are placed in a floating state and the channel portion voltage of the NAND strings is automatically boosted mainly by capacity-coupling with a pass voltage (for example, 10V) supplied to the non-selected word lines.

This automatic boosting operation is referred to as a "self-boost" operation.

FIG. 11 is a view explaining an operation where the data programming of a NAND type flash memory is carried out by a self-boost operation.

The NAND type flash memory of FIG. 11 is for convenience shown as a memory array where four memory transistors are connected in series to one NAND string connected to two bit lines, but in an actual memory array, the number of the memory transistors connected in series to one NAND string is generally as high as 16.

In FIG. 11, BLa and BLb denote bit lines. The bit line BLa has connected to it a NAND string comprised of two selection transistors ST1$a$ and ST2$a$ and four memory transistors MT1$a$ to MT4$a$ connected in series.

Further, the bit line BLb has connected to it a NAND string comprised of two selection transistors ST1$b$ and ST2$b$ and four memory transistors MT1$b$ to MT4$b$ connected in series.

The selection transistors ST1$a$ and ST1$b$ are controlled by a selection gate line SL1, while the selection transistors ST2*a* and ST2*b* are controlled by a selection gate line SL2. Further, the memory transistors MT1*a* to MT4*a* and MT1*b* to MT4*b* are controlled by word lines WL1 to WL4, respectively.

Next, an explanation will be made of an operation where MT2*a* is a memory transistor for which programming is prohibited and MT2*b* is a memory transistor which is to be programmed when the word line WL2 is selected and page programming is carried out in the NAND type flash memory of FIG. 11.

First, a power supply voltage VCC (3.3V) is supplied to the selection gate line SL1, a ground voltage GND (0V) is supplied to the selection gate line SL2, the power supply voltage VCC (3.3V) is supplied to the bit line BLa to which the memory transistor MT2*a* for which programming is prohibited is connected, and the ground voltage GND (0V) is supplied to the bit line BLb to which the memory transistor MT2*b* which is to be programmed is connected.

Next, a program voltage Vpgm (for example, 18V) is supplied to the selection word line WL2, and the pass voltage Vpass (for example, 10V) is supplied to the non-selected word lines WL1 and WL3 to WL4.

As a result, the channel portion of the NAND string to which the memory transistor MT2*a* for which programming is prohibited is connected becomes a floating state, the potential of the channel portion is mainly boosted by capacitor-coupling with the pass voltage Vpass supplied to the non-selected word lines (three in FIG. 11, but generally 15) and rises up to the programming prohibit voltage, and data programming to the memory transistor MT2*a* is prohibited.

On the other hand, the channel portion of the NAND string to which the memory transistor MT1*b* which is to be programmed is set to the ground voltage GND (0V), data is programmed to the memory transistor MT2*b* by the potential difference with the program voltage Vpgm supplied to the selected word line, and the threshold voltage shifts in the positive direction and becomes for example −3V to about 2V of the erasing state.

FIGS. 12A and 12B are views explaining the self-boost operation. FIG. 12A illustrates one memory transistor in the program prohibit NAND string at the time of a self-boost operation; and FIG. 12B is an equivalent circuit diagram thereof.

In FIG. 12A, VC is a voltage supplied to the word line WL (control gate CG), VF is a potential of the floating gate FG, Vch is a boosted NAND string channel potential, C-ono is an inter-layer capacity comprised by a three-layer insulation film between a control gate and a floating gate, C-tox is a tunnel oxide film capacity, and C-ch is a channel portion capacity of a memory transistor including a source/drain diffusion layer region. Further, L-dep is the length of spread of a depletion layer in the source/drain diffusion layer.

Further, in FIG. 12B, C-ins is a combined capacity comprised by a serial connection of the interlayer capacitor C-ono and the tunnel oxide film capacitor C-tox.

By the equivalent circuit of FIG. 12B, the NAND string channel potential Vch at the time of a self-boost operation is represented by equation (1):

$$Vch = Br * VC \tag{1}$$

Here, Br is a self-boost efficiency represented by the following equation (2) and usually is set at around 0.8 according to the optimum design of the device structure.

$$Br = C\text{-}ins/(C\text{-}ins + C\text{-}ch) \tag{2}$$

In the self-boost operation at the time of programming, VC of equation (1) becomes the weighted average of all voltages supplied to the word lines, but in a general NAND type flash memory, there are about 16 word lines constituting a NAND string, therefore the pass voltage supplied to the non-selected word lines becomes greater.

Accordingly, equation (1) may be represented as in equation (3).

$$Vch = Br * Vpass \tag{3}$$

Accordingly, if Br≈0.8 and Vpass=10V, Vch becomes almost equal to 8V and can sufficiently become the programming prohibit voltage.

The data programming operation of the NAND type flash memory using the above self-boost operation is suited to operation by a single power supply at a low voltage since it is not necessary to supply a high intermediate voltage to the non-selected bit lines, it enables high speed programming, and in addition enables easy layout of the data latch circuits for every bit line.

However, in order to realize a self-boost operation, it is necessary to make the self-boost efficiency Br large, i.e., 0.6 to 0.8 at the lowest.

When the self-boost efficiency Br cannot be sufficiently obtained, the NAND string channel potential Vch does not sufficiently rise, therefore, in the example of FIG. 11, there is a possibility that the non-selected memory transistor MT2*a* will be erroneously programmed.

Further, when it is intended to increase the channel potential Vch by raising the pass voltage Vpass, in the example of FIG. 11, there is a possibility that the memory transistors MT1*b* and MT3*b* to MT4*b* will be erroneously programmed.

Further, the self-boost efficiency Br cannot become about 1 in principle, therefore even in a case where the non-selected memory transistors are not erroneously programmed, degradation of the disturb tolerance cannot be avoided.

In the device structure of a NAND type flash memory, in order to set the self-boost efficiency Br as large as possible for avoiding the above problem, it is necessary to make the channel portion capacity C-ch of a memory transistor including a source/drain diffusion layer region smaller than that of equation (2). The P-type impurity concentration of the P-type well region in which the NAND type memory array is formed must be set low for this purpose.

If the P-type impurity concentration is set low as described above, however, the length of spread of the depletion layer L-dep illustrated in FIG. 12A becomes large, the punch through tolerance is lowered, the channels of the memory transistors and selection transistors can no longer be shortened, and consequently higher integration can no longer be realized.

That is, in the device structure of the NAND type flash memory of the related art, there is a tradeoff between securing the self-boost efficiency Br and shortening the channels of the memory transistors and the selection transistors, therefore it is difficult to both secure a disturb tolerance and a higher integration.

FIGS. 13A and 13B are graphs showing the tradeoff explained above.

In FIG. 13A, the abscissa indicates the concentration Ndope of the memory array PWELL, while the ordinate indicates the self-boost efficiency Br.

Further, in FIG. 13B, the abscissa indicates the concentration Ndope of the memory array PWELL, while the ordinate indicates the channel shortening limit Lmin of the memory transistors and selection transistor (TR).

It is understood from FIG. 13A that, in order to secure a sufficient self-boost efficiency Br, it is necessary to set the PWELL concentration Ndope low. On the other hand, it is understood from FIG. 30B that shortening of the channels of the memory transistors and selection transistors becomes difficult if the PWELL concentration Ndope is set low.

SUMMARY OF THE INVENTION

The present invention was made in consideration of such a circumstance and has as an object to provide a semiconductor nonvolatile memory device suited for operation by a single power supply at a low voltage, enabling easy layout of the data latch circuits for every bit line, and in addition performing a data programming operation with a good disturb tolerance, a method of data programming of the same, and a method of producing the same.

To achieve the above object, according to a first aspect of the present invention, there is provided a semiconductor nonvolatile memory device comprising a plurality of bit lines; a plurality of word lines; at least one source line; a plurality of memory blocks, each constituted by memory transistors which have control gate electrodes connected to the word lines and which are electrically programmed in data connected between the bit lines and the source lines via selection transistors, arranged in the form of a matrix; a means for decoding a source line connected to a selected memory block; a means for selecting the source line to which the selected memory block is connected and charging up the potential of channel portion of the selected memory block from the source line to the programming prohibit potential at the time of a data programming operation; a means for discharging the programming prohibit potential charged in the channel portion of the memory block to the bit line according to the content of data to be programmed; and a means for performing page programming together for memory transistors connected to the selected word line by supplying the programming voltage to the selected word line.

Preferably, the page programming is carried out in order from the memory transistor arranged close in position with respect to a bit line contact to the memory transistor arranged far in position with respect to the bit line contact.

Preferably, the bit lines are respectively connected to data latch circuits, the page programming data is transferred to the data latch circuits, and the potential of the channel portion of the memory block in which the selected memory transistor is located is discharged to the bit line according to the content of latched data at the time of the data programming operation.

Preferably, the memory blocks are NAND strings in which a plurality of memory transistors are connected in series.

According to a second aspect of the present invention, there is provided a method of data programming of a semiconductor nonvolatile memory device having a plurality of memory blocks constituted by memory transistors which are electrically programmed in data are connected between the bit line and the source line and arranged in the form of a matrix comprising a step of selecting the source line to which the selected memory block is connected and charging up the potential of the channel portion of the selected memory block from the source line to the programming prohibit potential; a step of discharging the programming prohibit potential charged in the channel portion of the memory block from the source line to the bit line in accordance with the content of the data to be programmed; and a step of performing page programming together for memory transistors connected to the selected word line by supplying the programming voltage to the selected word line.

Preferably, the memory blocks are NAND strings in which a plurality of memory transistors are connected in series.

According to a third aspect of the present invention, there is provided a semiconductor nonvolatile memory device comprising a plurality of bit lines; a plurality of word lines; at least one source line; a plurality of memory blocks, each constituted by memory transistors which have control gate electrodes connected to the word lines and which are electrically programmed in data connected between the bit lines and the source lines via selection transistors in which control gate electrodes are connected to selection gate lines, arranged in the form of a matrix; and a decoder for selecting the source line to which the selected memory block is connected and supplying voltage according to operations to the source line, the word lines, and the selection gate lines.

Preferably, the decoder is provided with a main decoding portion for generating a memory block selection signal designating an address of the selected memory block; a voltage generating portion for generating each voltage to be supplied to each word line, selection gate line, and source line to which the selected memory block is connected in the selected memory block; and at least one voltage transfer portion for transferring each voltage to be supplied to the word line, the selection gate line, and the source line by controlling the memory block selection signal.

Preferably, the voltage transfer portions of the decoder are constituted corresponding to each word line, selection gate line, and source line; the voltage transfer portions corresponding to each word line and selection gate line are constituted by at least one insulator gate type field-effect transistor and operate by opening or closing the insulator gate type field-effect transistor by control of the corresponding memory block selection signal; and the voltage transfer portion corresponding to the source line is constituted by two insulator gate type field-effect transistors connected in parallel and operates by opening or closing one insulator gate type field-effect transistor by control of the memory block selection signal of one memory block to which the source line is connected and another insulator gate type field-effect transistor by control of the memory block selection signal of another memory block to which the source line is connected.

Preferably, the word lines, the selection gates, and the source line are arranged in rows and connected to the decoder and the source line is used in common by two memory blocks adjacent in the column direction.

Preferably, the memory blocks are NAND strings in which a plurality of memory transistors are connected in series.

According to a fourth aspect of the present invention, there is provided a method of producing a semiconductor nonvolatile memory device having a plurality of memory blocks, each constituted by memory transistors which have control gate electrodes connected to the word lines and which are electrically programmed in data connected between bit lines and source lines via selection transistors which have control gate electrodes connected to selection gate lines, arranged in the form of a matrix, comprising a step of forming each floating gate electrode of each memory transistor by a first layer conductive layer film; a step of forming each word line and selection gate line by a second layer conductive layer film; a step of forming the source line by a third layer conductive layer film; and a step of forming each bit line by a fourth layer conductive layer film.

Preferably, the first layer conductive layer film is a first layer polycrystalline silicon layer; the second layer conductive layer film is a second layer polycrystalline silicon layer or polycrystalline silicide layer; the third layer conductive layer film is a first aluminum layer; and the fourth layer conductive layer film is a second aluminum layer.

Preferably, the memory blocks are NAND strings in which a plurality of memory transistors are connected in series.

According to a fifth aspect of the present invention, there is provided a method of producing a semiconductor nonvolatile memory device having a plurality of memory blocks, each constituted by memory transistors which have control gate electrodes connected to word lines and which are electrically programmed in data connected between bit lines and source lines via selection transistors which have control gate electrodes connected to selection gate lines, arranged in the form of a matrix, comprising a step of forming each floating gate electrode of each memory transistor by a first layer conductive layer film; a step of forming each word line and selection gate line by a second layer conductive layer film; a step of forming each bit line by a third layer conductive layer film, and a step of forming the source line by a fourth layer conductive layer film.

Preferably, the first layer conductive layer film is a first layer polycrystalline silicon layer; the second layer conductive layer film is a second layer polycrystalline silicon layer or polycrystalline silicide layer; the third layer conductive layer film is a first aluminum layer; and the fourth layer conductive layer film is a second aluminum layer.

Preferably, the memory blocks are NAND strings in which a plurality of memory transistors are connected in series.

The semiconductor nonvolatile memory device of the present invention, for example, a NAND type semiconductor nonvolatile memory device, is configured as a memory array in which source lines are arranged in rows. When the memory transistor is a memory transistor for which programming is prohibited, the potential of the NAND string channel portion is charged up to the programming prohibit potential via the selected source line.

Accordingly, the charging capacity is greatly reduced in comparison with the system of the related art of charging the potential of the non-selected NAND string channel portion up to the programming prohibit potential via the main bit line so the memory is suited for low voltage operation. Further, the layout of the data latch circuits becomes easy.

Further, it is possible to set the programming prohibit potential to a sufficiently high voltage in comparison with the self-boost operation of raising the potential of the NAND string channel portion by capacity-coupling of the voltage supplied to the word lines.

For this reason, the disturb tolerance at the time of data programming can be improved.

Further, in the NAND type semiconductor nonvolatile memory device of the present invention, the page programming is carried out in order from the memory transistor arranged far in position with respect to the source line to the memory transistor arranged close in position with respect to the source line in the memory block.

For this reason, it is possible to charge up the channel portion of the memory block to be page programmed to a sufficiently high voltage.

BRIEF DESCRIPTION OF THE DRAWINGS

These and other objects and features of the present invention will become clearer from the following description of the preferred embodiments given with reference to the attached drawings, in which:

FIG. 6, having FIGS. 6A and 6B, is a sectional view of the device structure in the pattern layout of FIG. 5 wherein FIG. 6A is taken along line A–A' of FIG. 5 and FIG. 6B is taken along line B–B' of FIG. 5;

FIGS. 9A through 9H are timing charts for explaining the operation in FIG. 5;

FIG. 10 is a view of the setting of the biases for a programming operation, an erasing operation, and a reading operation in the NAND type semiconductor nonvolatile memory device of the present invention;

DESCRIPTION OF THE PREFERRED EMBODIMENTS

Figure 1:
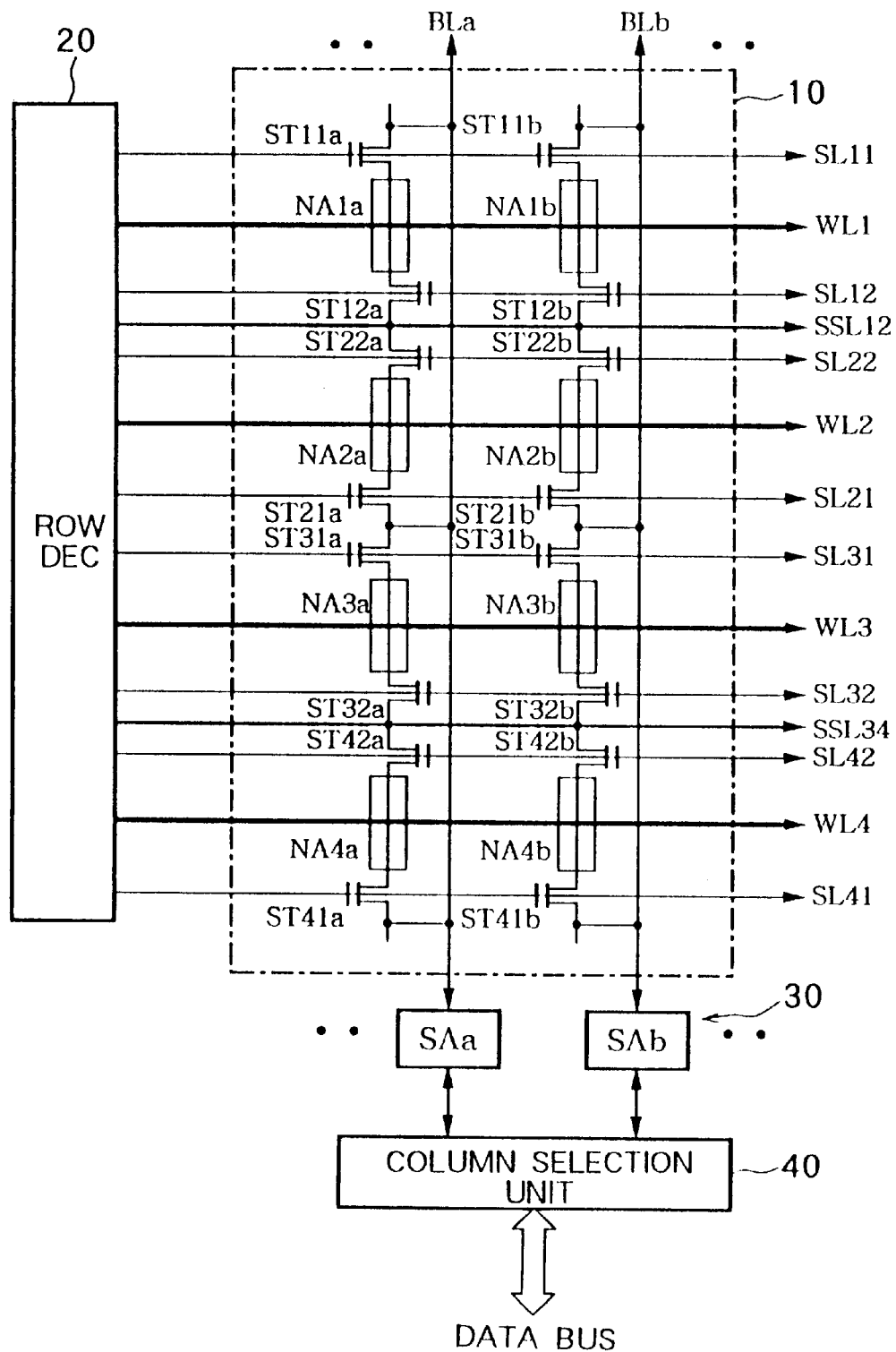
FIG. 1 is a view of an example of the configuration of a NAND type semiconductor nonvolatile memory device according to the present invention.

FIG. 1 is a view of an example of the configuration of a NAND type semiconductor nonvolatile memory device according to the present invention.

The NAND type semiconductor nonvolatile memory device of FIG. 1 is constituted by a memory array 10, a row decoder 20, a group of data latch circuits 30, and a column selection unit 40.

The NAND type semiconductor nonvolatile memory device of FIG. 1 is comprised of a memory array comprising two bit lines and two NAND strings connected for every bit line for convenience, but in an actual memory array, in the case of, a memory of for example, 64 Mbits, the number of the bit lines is 512 bytes (about 4000), 1024 NAND strings are connected to every bit line, and about 16 memory transistors are connected in series to each NAND string.

In the memory array 10, BLa and BLb denote bit lines, each bit line BLa and BLb is connected to four NAND strings respectively.

Namely, the NAND strings NA1a, NA2a, NA3a, and NA4a are connected to the bit line BLa, and the NAND strings NA1b, NA2b, NA3b, and NA4b are connected to the bit line BLb.

Each NAND string is constituted by serially connected memory transistors and controlled by a word line WL.

Each NAND string is operatively connected at its two terminals to the bit line and a source line arranged in a row direction via selection transistors.

Namely, the NAND string NA1a is connected to the bit line BLa via a selection transistor ST11a and connected to a source line SSL12 via a selection transistor ST12a.

The NAND string NA2a is connected to the bit line BLa via a selection transistor ST21a and connected to the source line SSL12 via a selection transistor ST22a.

The NAND string NA3a is connected to the bit line BLa via a selection transistor ST31a and connected to a source line SSL34 via a selection transistor ST32a.

The NAND string NA4a is connected to the bit line BLa and connected to the source line SSL34 via a selection transistor ST42a.

Further, the NAND string NA1b is connected to the bit line BLb via a selection transistor ST11b and connected to the source line SSL12 via a selection transistor ST12b.

The NAND string NA2b is connected to the bit line BLb via a selection transistor ST21b and connected to the source line SSL12 via a selection transistor ST22b.

The NAND string NA3b is connected to the bit line BLb via a selection transistor ST31b and connected to the source line SSL34 via a selection transistor ST32b.

The NAND string NA4b is connected to the bit line BLb and connected to the source line SSL34 via a selection transistor ST42b.

The selection transistors ST11a and ST11b are controlled by a selection gate line SL11, the selection transistors ST12a and ST12b are controlled by a selection gate line SL12, the selection transistors ST21a and ST21b are controlled by a selection gate line SL21, the selection transistors ST22a and ST22b are controlled by a selection gate line SL22, the selection transistors ST31a and ST31b are controlled by a selection gate line SL31, the selection transistors ST32a and ST32b are controlled by a selection gate line SL32, the selection transistors ST41a and ST41b are controlled by a selection gate line SL41, and the selection transistors ST42a and ST42b are controlled by a selection gate line SL42.

Each bit line BLa and BLb is respectively connected to data latch circuits SAa and SAb of the group of data latch circuits 30.

The row decoder 20 decodes word lines WL1 to WL4, the selection gate lines SL11 to SL42, and the source lines SSL12 and SSL34 arranged in the row direction according to address signals and supplies voltage corresponding to operations to the word lines, the selection gate lines, and the source lines.

Figure 2:
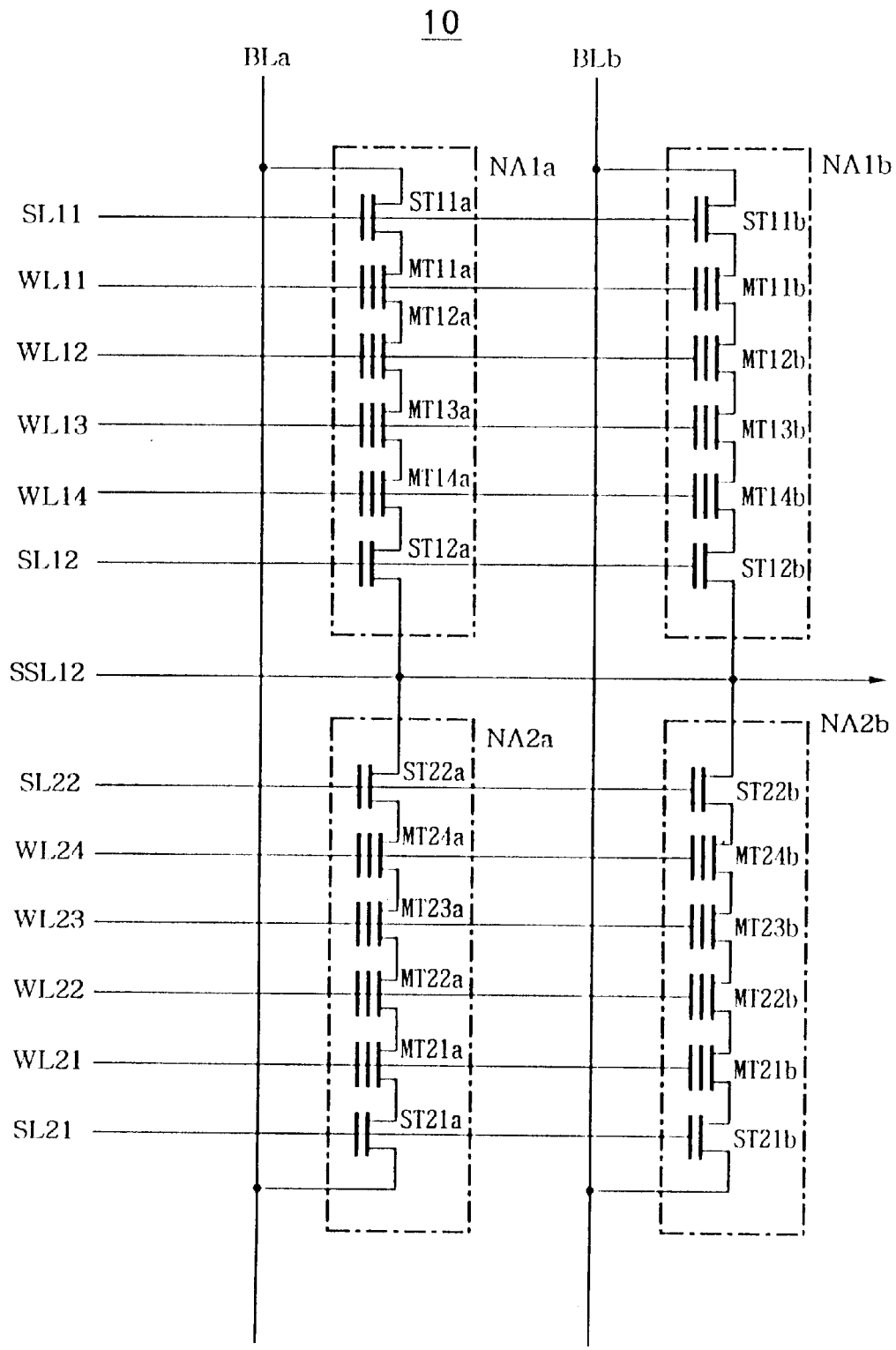
FIG. 2 is a view of the detailed configuration of a memory array in FIG. 1.

FIG. 2 is a view of the detailed configuration of he memory array 10 in the NAND type semiconductor nonvolatile memory device of FIG. 1. Only two bit lines nd two NAND strings for every bit line are illustrated for convenience.

In FIG. 2, two NAND strings are connected to each bit line BLa and BLb.

Namely, the bit line BLa is connected to NAND strings NA1a and NA2a, and the bit line BLb is connected to NAND strings NA1b and NA2b.

Each of the NAND strings NA1a, NA2a, NA1b, and NA2b is constituted by four serially connected memory transistors.

More especially, the NAND string NA1a is constituted by serially connected memory transistors MT11a to MT14a, the NAND string NA2a is constituted by serially connected memory transistors MT21a to MT24a, the NAND string NA1b is constituted by serially connected memory transistors MT11b to MT14b, and the NAND string NA2b is constituted by serially connected memory transistors MT21b to MT24b.

The memory transistors MT11a and MT11b are controlled by a word line WL11, the memory transistors MT12a and MT12b are controlled by a word line WL12, the memory transistors MT13a and MT13b are controlled by a word line WL13, the memory transistors MT14a and MT14b are controlled by a word line WL14, the memory transistors MT21a and MT21b are controlled by a word line WL21, the memory transistors MT22a and MT22b are controlled by a word line WL22, the memory transistors MT23a and MT23b are controlled by a word line WL23, and the memory transistors MT24a and MT24b are controlled by a word line WL24.

Each NAND string is operatively connected at the two terminals to the bit line and a source line arranged in the row direction via selection transistors.

Namely, the NAND string NA1a is connected to the bit line BLa via the selection transistor ST11a and connected to the source line SSL12 via the selection transistor ST12a.

The NAND string NA2a is connected to the bit line BLa via the selection transistor ST21a and connected to the source line SSL12 via the selection transistor ST22a.

The NAND string NA1b is connected to the bit line BLb via the selection transistor ST11b and connected to the source line SSL12 via the selection transistor ST12b.

The NAND string NA2b is connected to the bit line BLb via the selection transistor ST21b and connected to the source line SSL12 via the selection transistor ST22b.

The selection transistors ST11a and ST11b are controlled by the selection gate line SL11, the selection transistors ST12a and ST12b are controlled by the selection gate line SL12, the selection transistors ST21a and ST21b are controlled by the selection gate line SL21, and the selection transistors ST22a and ST22b are controlled by the selection gate line SL22.

Note that, in the configuration of FIG. 2, for convenience, four memory transistors are connected in series to one NAND string, but in an actual configuration, about 16 memory transistors are connected in series to one NAND string.

Figure 3:
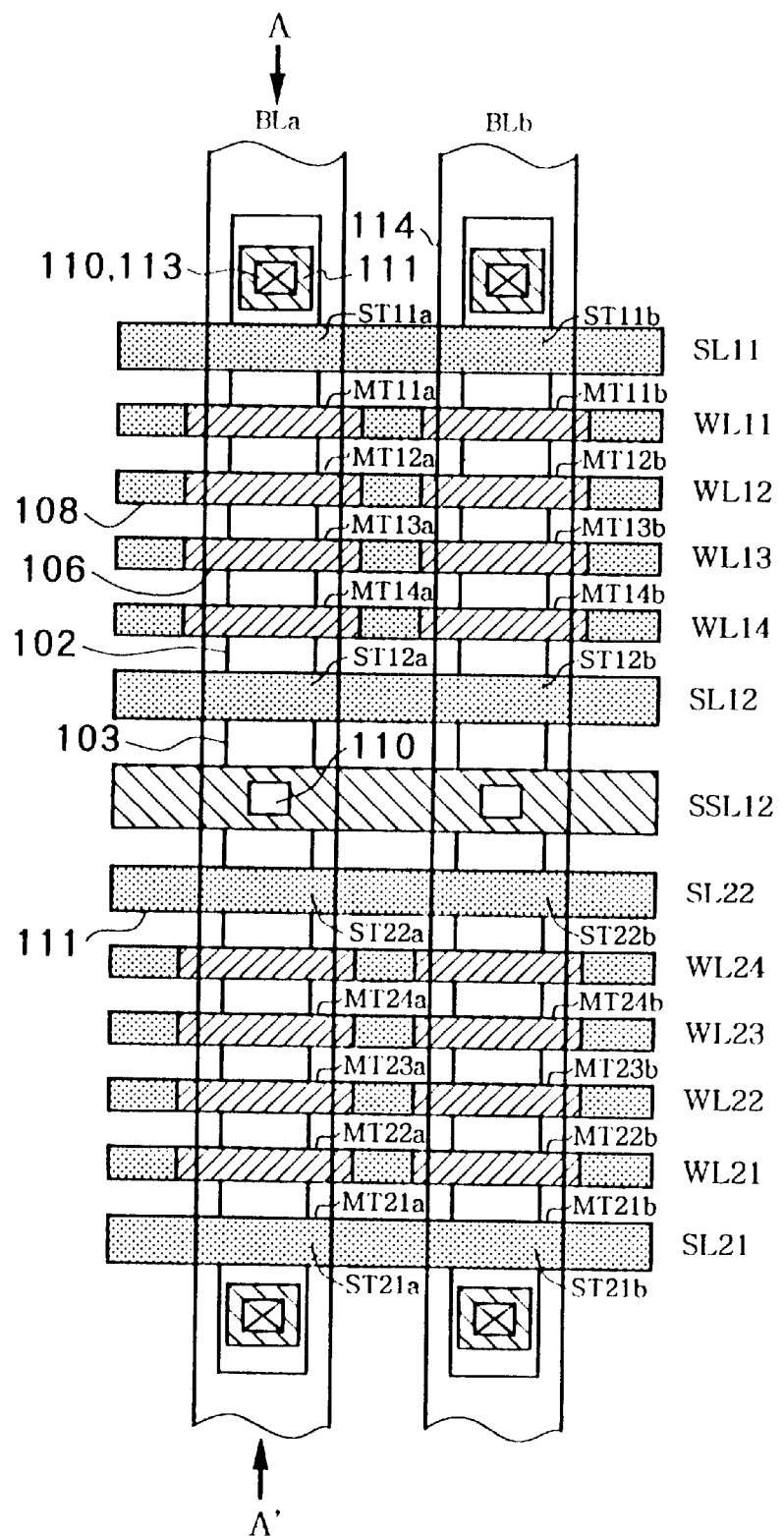
FIG. 3 is a view of a pattern layout of FIG. 2.

FIG. 3 is a view of the pattern layout of the NAND type semiconductor nonvolatile memory device of FIG. 2.

Figure 4:
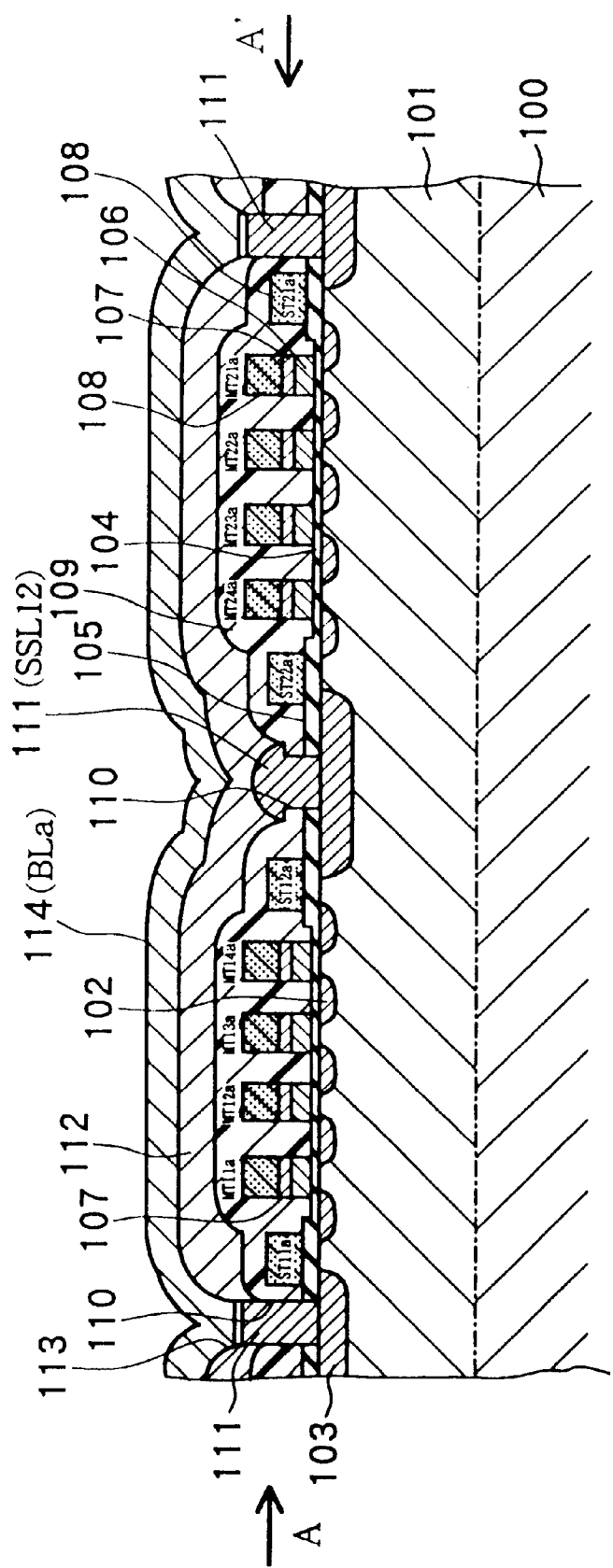
FIG. 4 is a sectional view of a device structure in the pattern layout of FIG. 3.

Further, FIG. 4 is a sectional view of a device structure in a direction A–A' in the pattern layout of FIG. 3.

In the semiconductor nonvolatile memory device of FIG. 3 and FIG. 4, a floating gate electrode of the memory transistor is formed by a first layer polycrystalline silicon interconnection, the word line and the selection gate line are formed by a second layer polycrystalline silicon interconnection, the source lines arranged in the row direction are formed by a first layer aluminum interconnection, and the bit line is formed by a second layer aluminum interconnection.

In FIG. 3 and FIG. 4, 100 denotes a semiconductor substrate, 101 denotes a P-type well region in which a memory array region is formed, 102 denotes a source and drain N-type diffusion layer of a memory transistor, 103 denotes an N-type diffusion layer of a source contact portion and a bit contact portion, 104 denotes a tunnel oxide film, 105 denotes a gate oxide film of a selection transistor portion, 106 denotes a first layer polycrystalline silicon gate electrode forming a floating gate electrode, 107 denotes an ONO-3 layer insulation film, 108 denotes second layer polycrystalline silicon interconnections forming control gate electrodes of the memory transistors and selection transistors, 109 an inter-layer insulation film under the first layer aluminum interconnections, 110 a contact hole under the first layer aluminum interconnections, 111 first layer aluminum interconnections forming the source lines arranged in the row direction, 112 an inter-layer insulation film under the second layer aluminum interconnections, 113 a contact hole under the second layer aluminum interconnections, and 114 second layer aluminum interconnections forming the source lines arranged in the row direction.

Figure 5:
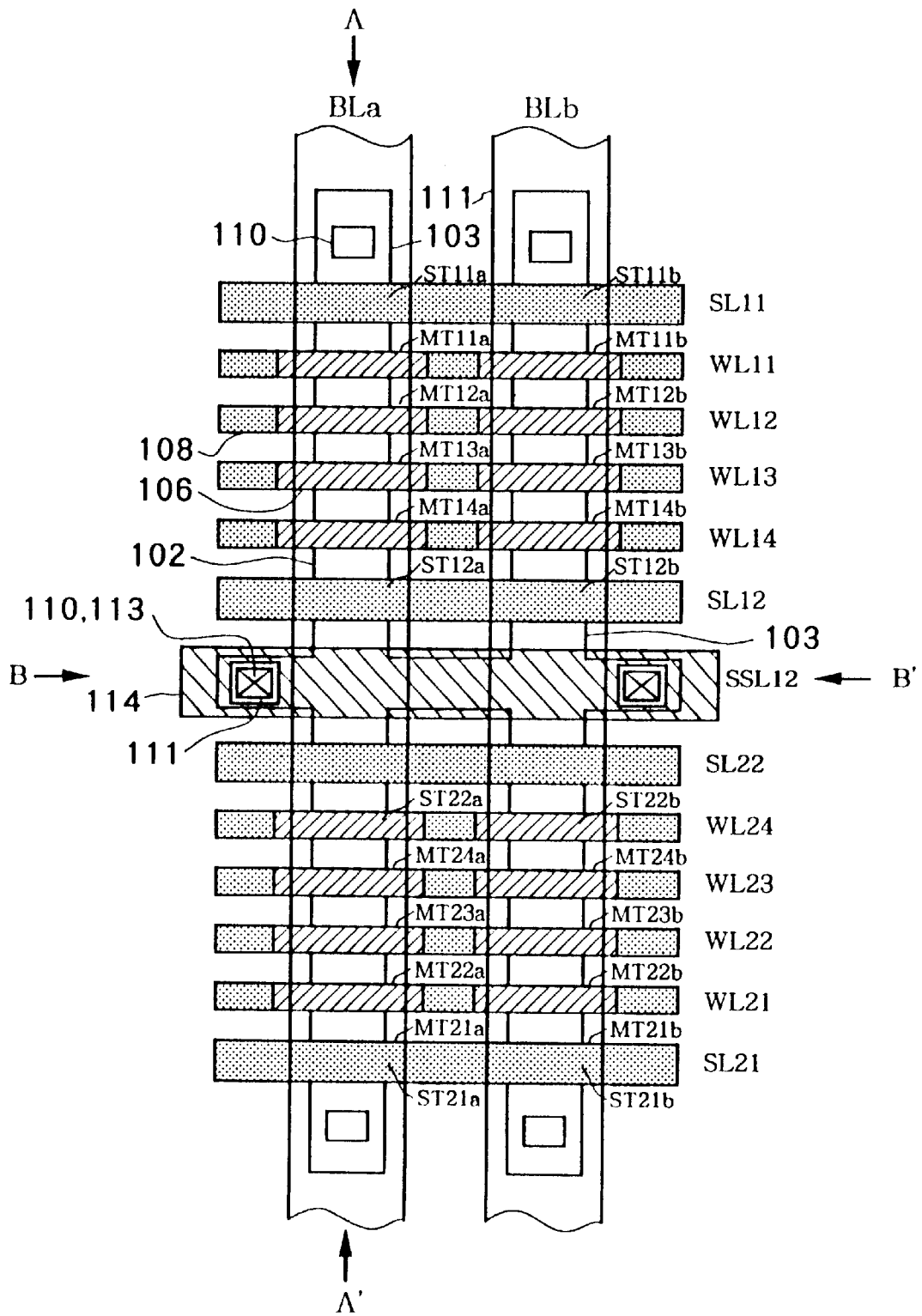
FIG. 5 is a view of another pattern layout of the memory array of FIG. 2.

FIG. 5 is a view of another pattern layout of the NAND type semiconductor nonvolatile memory device of FIG. 2.

Figure 6A:
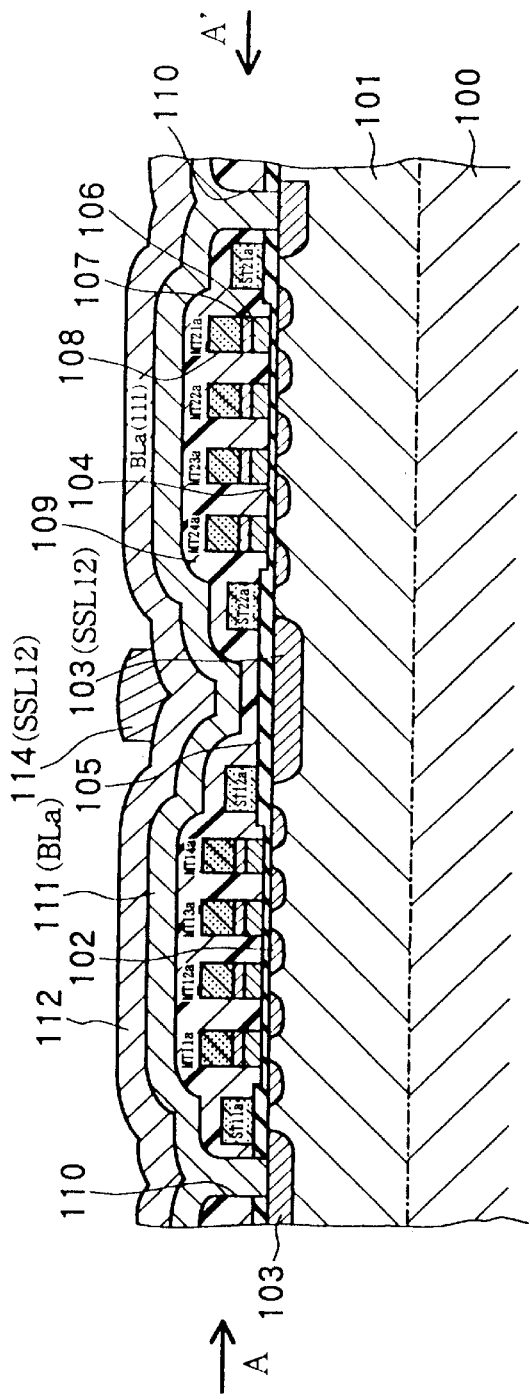
Figure 6B:
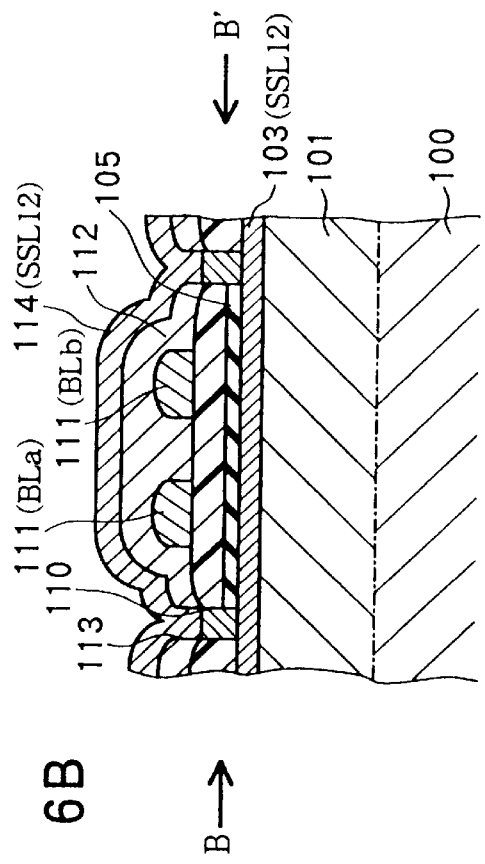

Further, FIGS. 6A and 6B are sectional views of the device structure of FIG. 5, in which FIG. 6A is a sectional view in the direction A–A' and FIG. 6B is a sectional view in the direction B–B'.

In the semiconductor nonvolatile memory device of FIG. 5 and FIGS. 6A and 6B, a floating gate electrode of the memory transistor is formed by a first layer polycrystalline silicon interconnection, the word line and the selection gate line are formed by a second layer polycrystalline silicon interconnection, the bit line is formed by a first layer aluminum interconnection, and the source line arranged in the row direction is formed by a second layer aluminum interconnection.

In the semiconductor nonvolatile memory device of FIG. 5 and FIGS. 6A and 6B, the bit interconnection having a smaller layout pitch is formed by the first layer aluminum interconnection, therefore this is more advantageous for reduction of the size of the chip in comparison with the case without the device of FIG. 3 and FIG. 4.

Note that, in FIG. 5 and FIGS. 6A and 6B, for convenience, the source diffusion layer is shown backed with the second layer aluminum interconnections every two bit lines, but in an actual memory array, the source diffusion layer is backed with the second layer aluminum interconnections every eight bit lines to 16 bit lines considering the increase of the area of the chip and the source diffusion resistance.

In FIG. 5 and FIGS. 6A and 6B, 100 denotes a semiconductor substrate, 101 denotes a P-type well region in which a memory array region is formed, 102 denotes a source and drain N-type diffusion layer of a memory transistor, 103 denotes an N-type diffusion layer of a source interconnection and a bit contact portion, 104 denotes a tunnel oxide film, 105 denotes a gate oxide film of the selection portion, 106 denotes a first layer polycrystalline silicon gate electrode forming a floating gate electrode, 107 denotes an ONO-3 layer insulation film, 108 denotes second layer polycrystalline silicon interconnections forming control gate electrodes of the memory transistors and selection transistors, 109 denotes an inter-layer insulation film under the third layer aluminum interconnections, 110 denotes a contact hole under the first layer aluminum interconnections, 111 denotes first layer aluminum interconnections forming the bit lines, 112 denotes an inter-layer insulation film under the second layer interconnections, 113 denotes a contact hole under the second layer aluminum interconnections, and 114 denotes the second layer aluminum interconnections forming the source lines arranged in the row direction.

Figure 7:
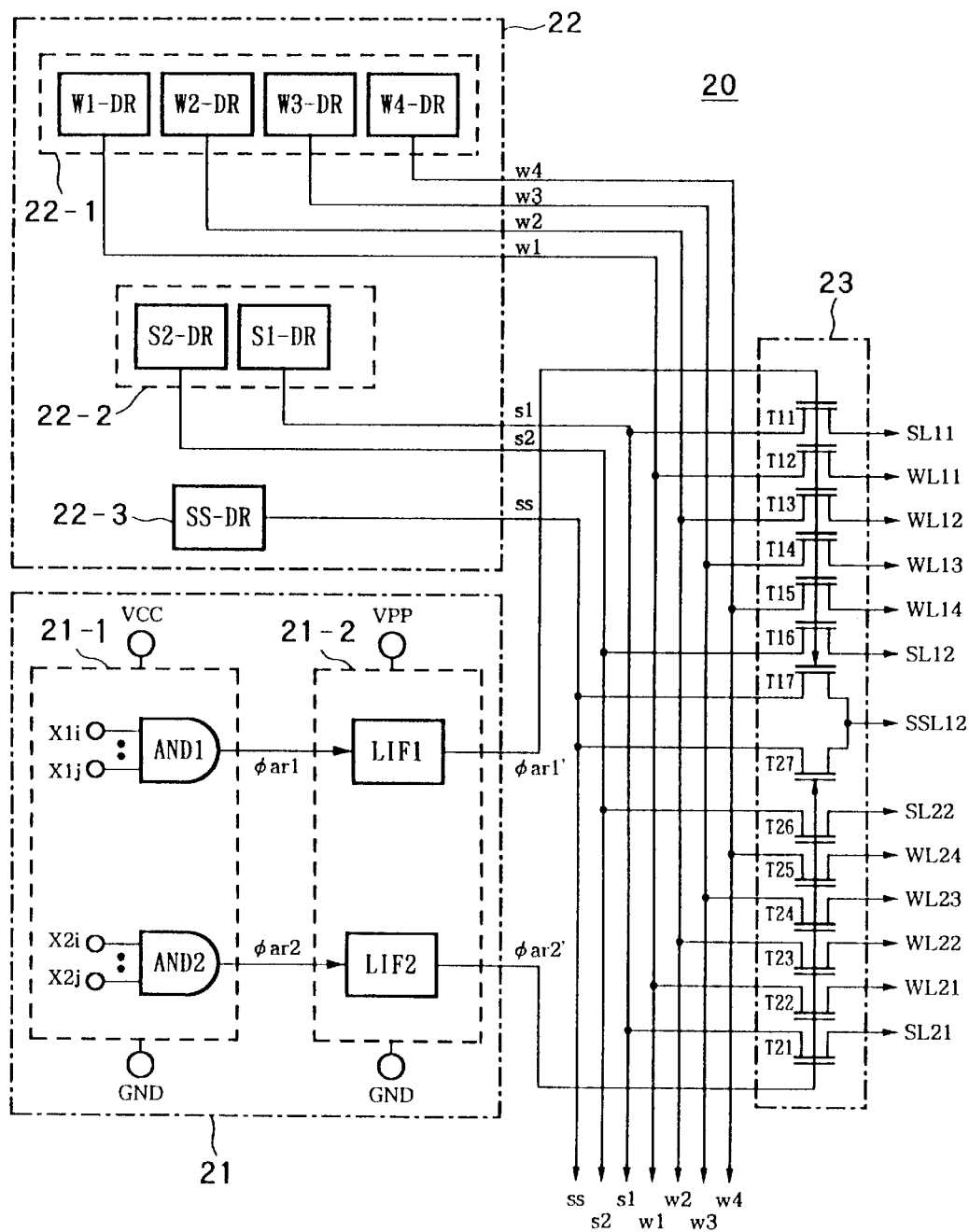
FIG. 7 is a view of the detailed configuration of the row recorder in FIG. 1.

FIG. 7 is a view of the detailed configuration of a row decoder 20 in the NAND type semiconductor nonvolatile memory device of FIG. 1.

In FIG. 7, only decoding portions for the word lines WL11 to WL14 and WL21 to WL24, the selection gate lines SL11 and SL12 and SL21 and SL22, and the source line SL12 are illustrated for convenience.

The row decoder 20 of FIG. 7 is characterized in that it is possible to decode the source line arranged in the row direction and supply the voltage according to operations to the source line in comparison with the row decoder of the related art decoder for only the word lines and the selection gate lines.

The row decoder 20 of FIG. 7 is provided with a main decoding portion 21 for generating a NAND string selection signal addressing the selected NAND string, a voltage generating portion 22 for generating each voltage to be supplied to each word line and selection gate line in the selected NAND string and the source line connected to the selected NAND string, and a voltage transfer portion 23 for transferring each voltage to be supplied to the corresponding word lines, selection gate lines, and source lines.

The main decoding portion 21 is constituted by a decoding portion 21-1 for decoding X address signals and outputting the VCC system NAND string selection signal φar and a level converting portion 21-2 for converting the level of the NAND string selection signal φar to a high voltage VPP system NAND string selection signal φar' and outputting the same.

The decoding portion 21-1 is provided with an AND circuit AND1 for decoding X address signals X11 to X1j and outputting a NA1a and NA1b system NAND string selection signal φar1 and an AND circuit AND2 for decoding X address signals X21 to X2j and outputting a NA2a and NA2b system NAND string selection signal φar2.

The level converting portion 21-2 is provided with a level converting circuit LIF1 for converting the NAND string selection signal φar1 to the VPP system NAND string selection signal φar1' and outputting the same and a level converting circuit LIF2 for converting the level of the NAND string selection signal φar2 to the VPP system NAND string selection signal φar2' and outputting the same.

The voltage generating portion 22 is constituted by a word line voltage generating portion 22-1 for generating a voltage to be supplied to the word lines, a selection gate line voltage generating portion 22-2 for generating a voltage to be supplied to the selection gate lines, and a source line voltage generating portion 22-3 for generating a voltage to be supplied to the source lines.

The word line voltage generating portion 22-1 is constituted by voltage generating circuits WI-DR to W4-DR provided corresponding to four word lines in a selected NAND string. The voltage generating circuit W1-DR generates a first voltage w1 to be supplied to word lines WL11 and WL12, the voltage generating circuit W2-DR generates a second voltage w2 to be supplied to word lines WL11 and WL12, the voltage generating circuit W3-DR generates a third voltage w3 to be supplied to word lines WL13 and WL23, and the voltage generating circuit W4-DR generates a fourth voltage w4 to be supplied to word lines WL14 and WL24.

The selection gate line voltage generating portion 22-2 is constituted by a voltage generating circuits S1-DR and S2-DR provided corresponding to two selection gate lines in a selected NAND string. The voltage generating circuit S1-DR generates a first voltage s1 to be supplied to selection gate lines SL11 and SL21, and the voltage generating circuit S2-DR generates a second voltage s2 to be supplied to selection gate lines SL12 and SL22.

The source line voltage generating portion 22-3 is constituted by a voltage generating circuit SS-DR for generating a voltage ss to be supplied to the source line connected to the selected NAND string.

A voltage transfer portion 23 is provided corresponding to every word line, selection gate line, and source line. In FIG. 7, voltage transfer portions are provided corresponding to the word lines WL11 to WL14 and WL21 to WL24, the selection gate lines SL11 and SL12 and SL21 and SL22, and the source line SSL12.

Namely, transfer transistors T12 to T15 are provided corresponding to the word lines WL11 to WL14, and the transfer transistors T11 and T16 are provided corresponding to the selection gate lines SL11 and SL12.

The transfer transistors T11 to T16 are controlled by the NAND string selection signal φar1' to transfer the voltages w1 to w4 to the corresponding word lines WL11 to WL14 and transfer the voltages s1 and s2 to the corresponding selection gate lines SL1 and SL.

Further, the transfer transistors T22 to T25 are provided corresponding to the word lines WL21 to WL25, and the transfer transistors T21 and T26 are provided corresponding to the selection gate lines SL21 and SL22.

The transfer transistors T21 to T26 are controlled by the NAND string selection signal φar2' to transfer the voltages w1 to w4 to the corresponding word lines WL21 to WL24 and transfer the voltage s1 and s2 to the corresponding selection gate lines SL21 and SL22.

The transfer transistors T17 and T27 are provided corresponding to the source line SSL12. The transfer transistor T17 is controlled by the NAND string selection signal φar1', while the transfer transistor T27 is controlled by the NAND string selection signal φar2'.

Accordingly, the source line SSL12 is connected to the NA1a and NA1b system NAND strings when the NAND string selection signal φar1' is set to a high level and connected to the NA2a and NA2b system NAND strings when the NAND string selection signal φar2' is set to the high level.

Next, an explanation will be made of a data programming operation in the NAND type semiconductor nonvolatile memory devices of FIG. 1 and FIG. 2 in relation to FIG. 8.

Figure 8:
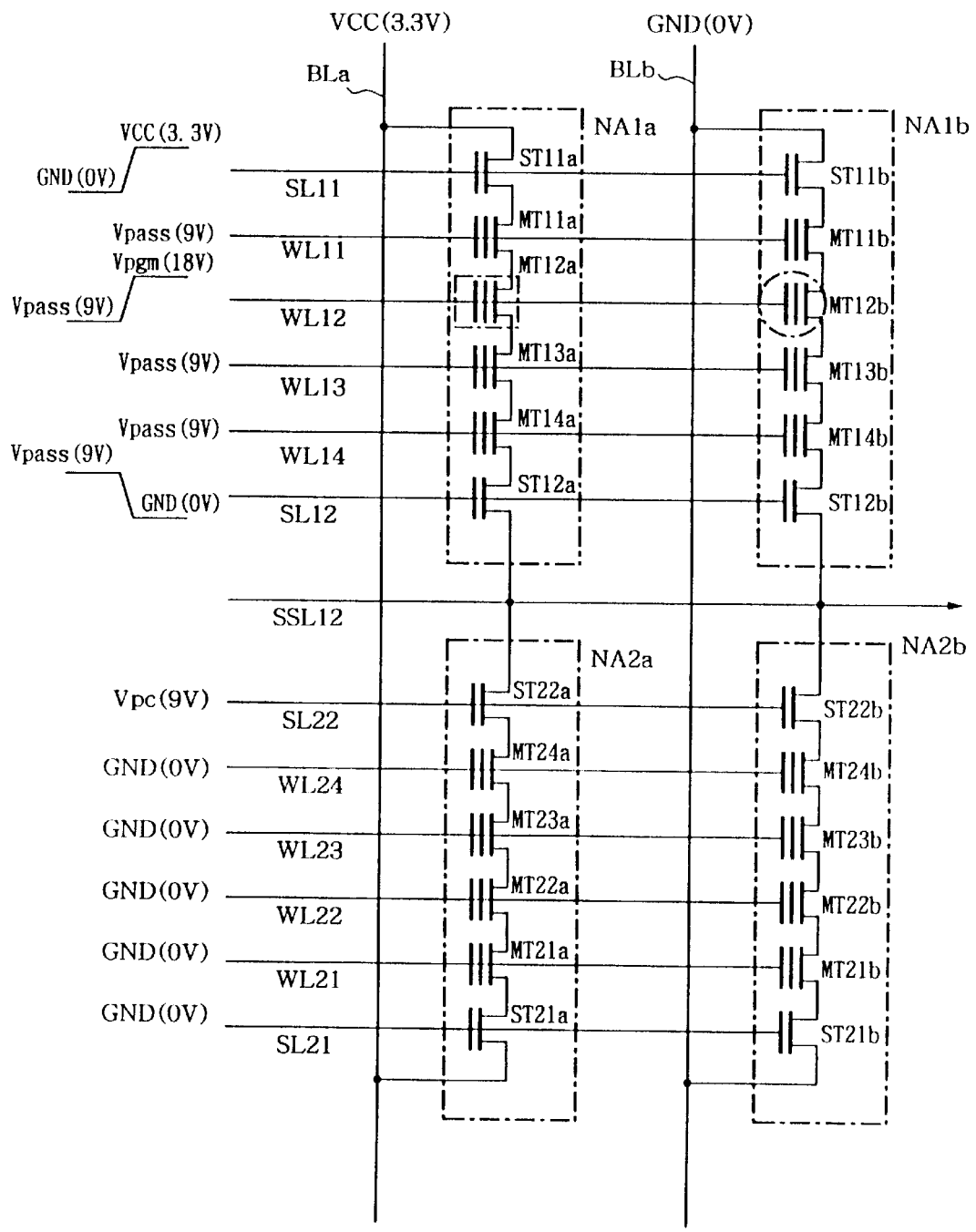
FIG. 8 is a view for explaining a data programming operation in a NAND type semiconductor nonvolatile memory device of the present invention.
Figure 11:
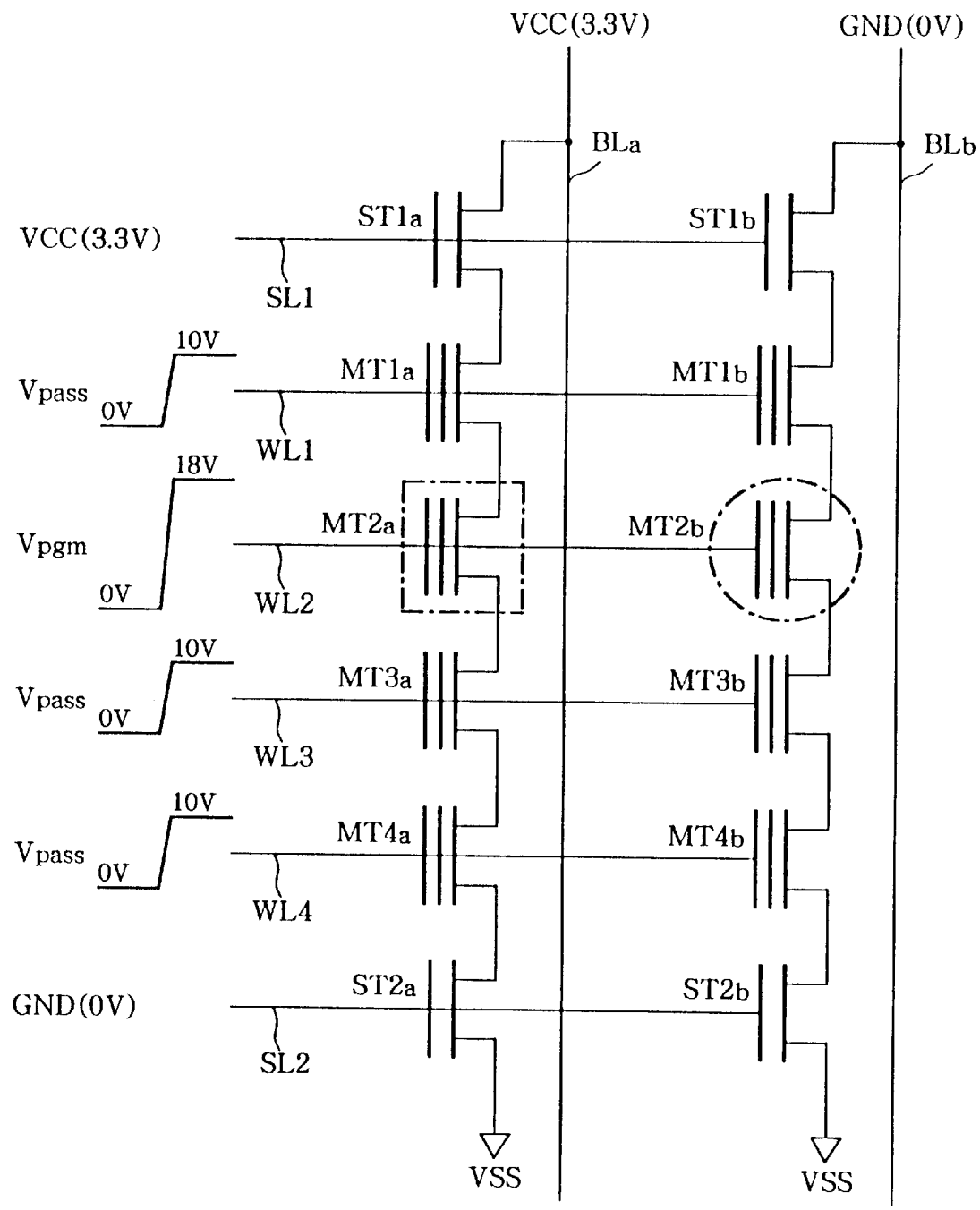
FIG. 11 is a view for explaining a data programming operation using a self-boost operation.
Figure 12A:
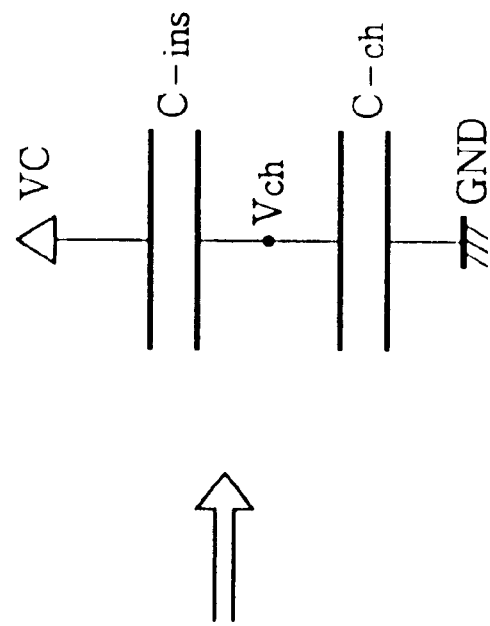
FIG. 12A illustrates a memory transistor at the time of a self-boost operation.
Figure 12B:
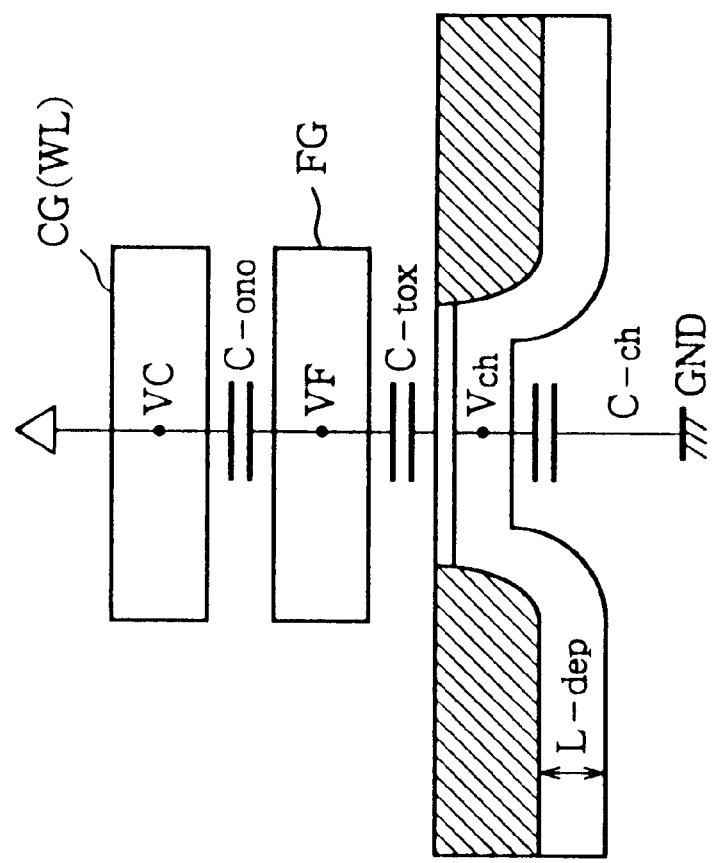
FIG. 12B is an equivalent circuit diagram thereof.
Figure 13A:
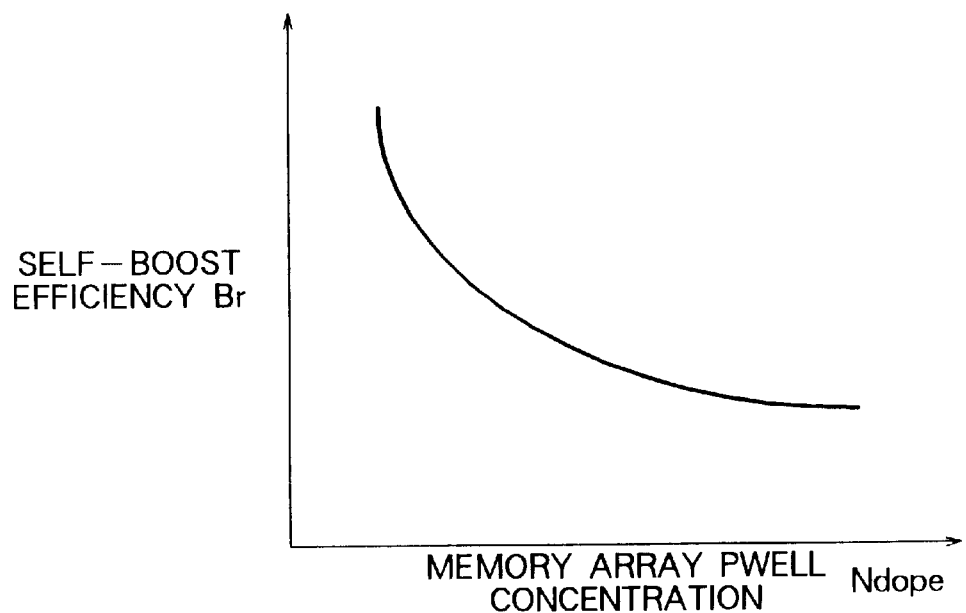
FIGS. 13A and 13B are views for explaining the fact that there is a tradeoff between securing of the self-boost efficiency Br and the shortening of the channels of transistors.
Figure 13B:
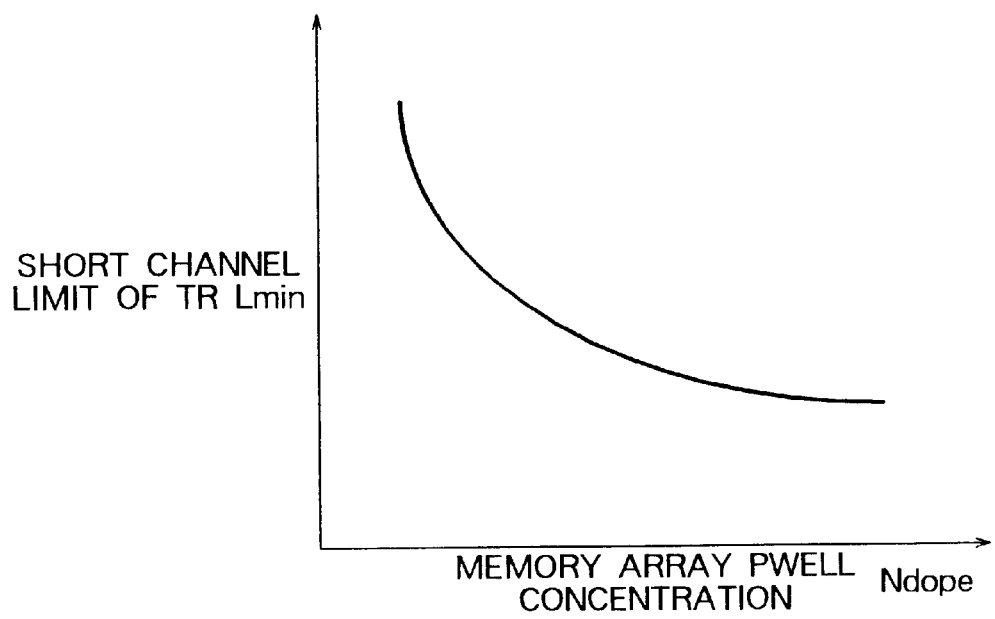

FIG. 8 is a view explaining an operation where MT12a in the NAND string NA1a is a memory transistor for which programming is prohibited and MT12b in the NAND string NA1b is a memory transistor which is to be programmed when page programming is carried out by selecting the word line WL12.

First, in a state where the ground voltage GND (0V) is supplied to the selection gate line SL11 and the NAND strings NA1a and NA1b are separated from the bit lines BLa and BLb, the pass voltage Vpass (9V) is supplied to the selection gate line SL12 and the word lines WL11 to WL14. By this, the channel portions of the NA1a and NA1b system NAND strings become conductive, and the channel portion of each NAND string is precharged from the source line SSL12 to the programming prohibit voltage (9V).

Next, in a state where the selection gate line SL12 falls to the ground voltage GND (0V) and the source line SSL12 is isolated, the selection gate line SL11 is raised to the power supply voltage VCC (3.3V).

Here, the bit line BLa to which the memory transistor MT12a for which programming is prohibited is connected is set to the power supply voltage VCC (3.3V), and the bit line BLb to which the memory MT12b transistor which is to be programmed is connected is set to the ground voltage GND (0V) via respectively corresponding data latch circuits.

As a result, the channel portion of the NAND string NA1a in which memory transistor MT12a for which programming is prohibited is located is held at the programming prohibit potential while in the floating state, but the programming prohibit potential of the channel portion of the NAND string NA1b where the memory transistor MT12b to be programmed is located is discharged to the bit line BLb.

Simultaneously, the voltage supplied to the selected word line WL12 is raised to the programming voltage Vpgm (18V).

As a result, the memory transistor MT12a for which the programming is prohibited is held in the erasing state by the programming prohibit voltage, the data is programmed in the memory transistor MT12b to be programming by the program voltage Vpgm, and the threshold voltage shifts in the positive direction and becomes for example −3V to about 2V of the erasing state.

On the other hand, the non-selected NA2a and NA2b system NAND strings is not effected by the above mentioned data programming operation since the corresponding word lines WL21 to WL24 and selection gate lines SL21 to SL22 are set to the ground voltage GND (0V).

In the embodiment of FIG. 8 explained above, the charging capacity can be greatly reduced in comparison with the system of the related art of charging the potential of the non-selected NAND string channel portion up to the programming prohibit potential via the bit line. Therefore, the embodiment is suited to a low voltage operation and further the layout of the data latch circuits is easy.

Further, it is possible to set the programming prohibit potential to a sufficiently high voltage (about 9V) in comparison with the self-boost operation of the related art of raising the potential of the NAND string channel portion by the capacity coupling of the voltage supplied to the word lines.

Accordingly, the disturb tolerance with respect to the non-selected memory transistors can be improved.

FIGS. 9A to 9H are timing charts of the operation explained in relation to FIG. 8 explained above.

Below, the data programming operation of FIG. 8 will be explained in further detail by referring to the timing charts of FIGS. 9A to 9H.

First, φP/R shown in FIG. 9A is a program/verify control signal. A first programming/verifying operation is carried out in a period from the time t1 to t4 in the figure, and a second programming/verifying operation is carried out in a period from the time t4 to t7.

First, the first programming operation is commenced at the time t1. As shown in FIG. 9B, the ground voltage GND (0V) is supplied to the selection gate line SL11. In the state separated from the bit line BLa and BLb, as shown in FIGS. 9C, 9E, and 9F, the pass voltage Vpass (9V) is supplied to the selection gate line SL12 and the word lines WL11 to WL14. By this, the channel portions of the NA1a and NA1b system NAND strings become conductive. In this state, as shown in FIG. 9D, the source line SSL12 is selected and supplied with the precharging voltage Vpc (9V).

As a result, as shown in FIGS. 9G and 9H, the channel portion potential VCHa of the NAND string NA1a and the channel portion potential VCHb of the NAND string NA1b are charged up to the programming prohibit voltage Vpc (9V) via the source line SSL12.

Next, as shown in FIGS. 9C and 9B, at the time t2, the selection gate line SL12 falls to the ground voltage GND (0V), and the selection gate line SL11 is raised to the power supply voltage VCC (3.3V).

As a result, as shown in FIGS. 9G and 9H, the potential VCHa of the channel portion at which the memory transistor for which programming is prohibited is located is held at the programming prohibit potential while in the floating state, but the programming prohibit potential of the potential VCHb of the channel portion at which the memory transistor which is to be programmed is located is discharged and becomes the ground voltage GND (0V).

On the other hand, as shown in FIG. 9E, the program voltage Vpgm (18V) is supplied to the selected word line.

During the period from the time t2 to t3, page programming is carried out together for memory transistors connected to the word line.

Next, the period from the time t3 to t4 is a first verifying operation period. As shown in FIG. 9E, the ground voltage GND is supplied to the selection gate line and as shown in FIGS. 9B, 9D, and 9F, the power supply voltage VCC is supplied to all non-selected word lines and the selection gate lines SL11 and SL12. A verifying operation similar to that of the usual NAND type flash memory is carried out in the pass state.

Further, the period from the time t4 to t7 is a second programming/verifying operation period. This is a repetition of the first programming/verifying operation.

Note that, when the page programming is carried out in the NAND type semiconductor nonvolatile memory device of the present invention, it is preferable to perform the page programming in order from the memory transistor arranged close in position with respect to the bit line contact to the memory transistor arranged far in position with respect to the bit line contact.

This is opposite to the NAND type semiconductor nonvolatile memory device of the related art which performs a page programming operation successively from the memory transistor arranged far in position with respect to the bit line contact to the memory transistor arranged close in position with respect to the bit line contact.

Accordingly, in the NAND string, since the page programming is carried out in order from the memory transistor arranged far in position with respect to the source line to the memory transistor arranged close in position with respect to the source line, it is possible to charge up the potential of the NAND string channel portion to be page programmed to the programming prohibit potential.

FIG. 10 is a view of the setting of the biases for the programming operation, the erasing operation, and the reading operation already explained with regard to the NAND type semiconductor nonvolatile memory device of the present invention of FIGS. 1 to FIGS. 9A to 9H.

Note that, in the figure, the programming operation is for convenience shown divided into an operation at the time of precharging (times t1 to t2 in FIGS. 9A to 9H) and an operation at the time of the real programming (times t2 to t3 in FIGS. 9A to 9H).

In FIG. 10, the programming operation is as already explained, so a repeat explanation will be omitted.

The erasing operation is basically the same as that of the NAND type flash memory of the related art. 0V is supplied to all word lines of the selected NAND string lock, and a high voltage (Verase=22V) is supplied to all word lines of the non-selected NAND string blocks and the substrate PWELL of the memory array.

As a result, electrons are pulled out of the floating gates of the memory transistors of the selected NAND string block to the substrate. The threshold voltage of the memory transistor shifts in the negative direction and becomes for example about −3V.

Also, the read operation is basically the same as that of the NAND type flash memory of the related art. In the selected NAND string block, the ground voltage GND is supplied to the selected word line and the selected source line, the power supply voltage VCC is supplied to all non-selected word lines and selection gate lines, and a read operation similar to that of the usual NAND type flash memory is carried out in the pass state.

As explained above, the NAND type semiconductor nonvolatile memory device of the present embodiment is configured by a memory array in which source lines are arranged in rows. When the memory transistor is a memory transistor for which programming is prohibited, the potential of the NAND string channel portion is charged up to the programming prohibit potential.

Accordingly, since the charging capacity can be greatly reduced in comparison with a system of the elated art for charging the potential of the non-selected NAND string channel portion up to the programming prohibit potential via the main bit line, the memory is suited to a low voltage operation and further the layout of the data latch circuits becomes easy.

Further, it is possible to set the programming prohibit potential to a sufficiently high voltage in comparison with a self-boost operation of raising the potential of the NAND string channel portion by the capacity coupling of the voltage supplied to the word lines.

For this reason, the disturb tolerance at the time of the data programming can be improved.

Further, according to the NAND type semiconductor nonvolatile memory device of the present embodiment, since the page programming is carried out in order from the memory transistor arranged far in position with respect to the source line to the memory transistor arranged close in position with respect to the source line, in the NAND string, it is possible to charge up the potential of the NAND string channel portion to be page programmed to the programming prohibit potential.

Note that, in the present embodiment, an explanation was made of the NAND type flash memory as an example, but needless to say the present invention may be applied to another type of flash memory, for example, an AND type flash memory.

While the invention has been described with reference to specific embodiments chosen for purposes of illustration, it should be apparent that numerous modifications could be made thereto by those skilled in the art without departing from the basic concept and scope of the invention.

What is claimed is:

1. A semiconductor nonvolatile memory device, comprising:

a plurality of bit lines;

a plurality of word lines;

at least one source line;

a plurality of memory blocks, each constituted by memory transistors which have control gate electrodes connected to the word lines and which are electrically programmed in data connected between the bit lines and the source lines via selection transistors, arranged in the form of a matrix;

a means for decoding a source line connected to a selected memory block;

a means for selecting the source line to which the selected memory block is connected and charging up the potential of channel portion of the selected memory block from the source line to the programming prohibit potential at the time of a data programming operation;

a means for discharging the programming prohibit potential charged in the channel portion of the memory block to the bit line according to the content of data to be programmed; and a means for performing page programming together for memory transistors connected to the selected word line by supplying the programming voltage to the selected word line.

2. A semiconductor nonvolatile memory device according to claim 1, wherein the page programming is carried out in order from the memory transistor arranged close in position with respect to a bit line contact to the memory transistor arranged far in position with respect to the bit line contact.

3. A semiconductor nonvolatile memory device according to claim 1, wherein:

the bit lines are respectively connected to data latch circuits, and the page programming data is transferred to the data latch circuits, and the potential of the channel portion of the memory block in which the selected memory transistor is located is discharged to the bit line according to the content of latched data at the time of the data programming operation.

4. A semiconductor nonvolatile memory device according to claim 1, wherein the memory blocks are NAND strings in which a plurality of memory transistors are connected in series.

5. A method of data programming of a semiconductor nonvolatile memory device having a plurality of memory blocks constituted by memory transistors which are electrically programmed in data are connected between the bit line and the source line and arranged in the form of a matrix comprising:

a step of selecting the source line to which the selected memory block is connected and charging up the potential of the channel portion of the selected memory block from the source line to the programming prohibit potential;

a step of discharging the programming prohibit potential charged in the channel portion of the memory block from the source line to the bit line in accordance with the content of the data to be programmed; and a step of performing page programming together for memory transistors connected to the selected word line by supplying the programming voltage to the selected word line.

6. A method of data programming of a semiconductor nonvolatile memory device according to claim 5, wherein the memory blocks are NAND strings in which a plurality of memory transistors are connected in series.

7. A semiconductor nonvolatile memory device, comprising:

a plurality of bit lines;

a plurality of word lines;

at least one source line;

a plurality of memory blocks, each constituted by memory translators which have control gate electrodes connected to the word lines and which are electrically programmed in data connected to selection gate lines, arranged in the form of a matrix; and a decoder for selecting the source line to which the selected memory block is connected and supplying voltage according to operations to the source line, the word lines, and the selection gates lines;

wherein the decoder is provided with:

a main decoding portion for generating a memory block selection signal designating an address of the selected memory block;

a voltage generating portion for generating each voltage to be supplied to each word line, selection gate line, and source line to which the selected memory block is connected in the selected memory block; and at least one voltage transfer portion for transferring each voltage to be supplied to the word line, the selection gate line, and the source line by controlling the memory block selection signal.

8. A semiconductor nonvolatile memory device according to claim 7, wherein:

the voltage transfer portions of the decoder are constituted corresponding to each word line, selection gate line, and source line;

the voltage transfer portions corresponding to each word line and selection gate line are constituted by at least one insulator gate type field-effect transistor and operate by opening or closing the insulator gate type field-effect transistor by control of the corresponding memory block selection signal; and the voltage transfer portion corresponding to the source line is constituted by two insulator gate type field-effect transistors connected in parallel and operates by opening or closing one insulator gate type field-effect transistor by control of the memory block selection signal of one memory block to which the source line is connected and another insulator gate type field-effect transistor by control of the memory block selection signal of another memory block to which the source line is connected.

9. A semiconductor nonvolatile memory device according to claim 8, wherein:

the word lines, the selection gates, and the source line are arranged in rows and connected to the decoder and the source line is used in common by two memory blocks adjacent in the column direction.

10. A semiconductor nonvolatile memory device according to claim 7, wherein the memory blocks are NAND strings in which a plurality of memory transistors are connected in series.

* * * * *